United States Patent [19]

Akaogi et al.

[11] Patent Number: 5,631,597
[45] Date of Patent: May 20, 1997

[54] NEGATIVE VOLTAGE CIRCUIT FOR A FLASH MEMORY

[75] Inventors: Takao Akaogi; Hiromi Kawashima; Tetsuji Takeguchi; Ryoji Hagiwara; Yasushi Kasa; Kiyoshi Itano; Yasushige Ogawa; Shouichi Kawamura, all of Kawasaki, Japan

[73] Assignee: Fujitsu Limited, Kanagawa, Japan

[21] Appl. No.: 445,103

[22] Filed: May 19, 1995

Related U.S. Application Data

[62] Division of Ser. No. 98,406, Aug. 6, 1993, abandoned.

[30] Foreign Application Priority Data

| Dec. 9, 1991 | [JP] | Japan | 3-324701 |
| Dec. 27, 1991 | [JP] | Japan | 3-346571 |
| Jan. 14, 1992 | [JP] | Japan | 4-4678 |
| Mar. 19, 1992 | [JP] | Japan | 4-64143 |
| Jun. 5, 1992 | [JP] | Japan | 4-145300 |
| Jun. 15, 1992 | [JP] | Japan | 4-154958 |
| Sep. 25, 1992 | [JP] | Japan | 4-256594 |
| Nov. 10, 1992 | [JP] | Japan | 4-299987 |
| Dec. 9, 1992 | [JP] | Japan | PCT/JP92/01608 |

[51] Int. Cl.$^6$ .................................................. G05F 1/10
[52] U.S. Cl. ........................................ 327/536; 327/537
[58] Field of Search ............................... 327/535, 536, 327/537, 589

[56] References Cited

U.S. PATENT DOCUMENTS

| 4,591,738 | 5/1986 | Bialas et al. | 327/537 |
| 4,628,214 | 12/1986 | Leuschner | 327/536 |
| 4,905,314 | 2/1990 | Kato et al. | 327/589 |
| 5,247,208 | 9/1993 | Nakayama | 327/537 |
| 5,315,188 | 5/1994 | Lee | 327/536 |

FOREIGN PATENT DOCUMENTS

| 49-126249 | 12/1974 | Japan . |
| 50-140225 | 11/1975 | Japan . |
| 60-211699 | 10/1985 | Japan . |
| 60-229300 | 11/1985 | Japan . |
| 61-186019 | 8/1986 | Japan . |
| 1-273357 | 11/1989 | Japan . |
| 2-71499 | 3/1990 | Japan . |
| 3-203097 | 9/1991 | Japan . |

OTHER PUBLICATIONS

Sedra et al., Microelectronic Circuits, 1991, FIG. 5.21.

Primary Examiner—Timothy P. Callahan
Assistant Examiner—Jung Ho Kim
Attorney, Agent, or Firm—Nikaido, Marmelstein, Murray & Oram LLP

[57] ABSTRACT

A negative-voltage circuit for realizing a flash memory is installed independently and is applied selectively to word lines in response to signals sent from row decoders. Row decoders for specifying word lines need not be installed in the negative voltage circuit. The negative circuit can therefore be reduced in scale.

5 Claims, 16 Drawing Sheets

FOR WRITING

FOR READING

FOR ERASING
(POSITIVE-VOLTAGE
APPLICATION)

FOR ERASING
(NEGATIVE-VOLTAGE
APPLICATION)

CLK

NODE 555

NEGATIVE-VOLTAGE
OUTPUT TERMINAL 554

Fig.17A CLK
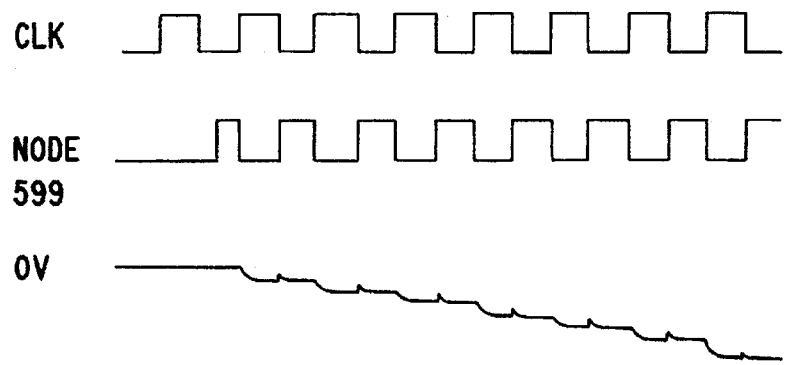
Fig.17B NODE 599
Fig.17C 0V
WL1~WL4
Fig.19A SL
Fig.19B CLK
Fig.19C NODE 599
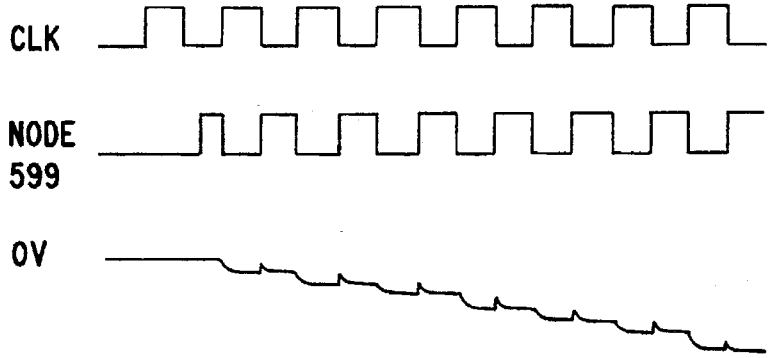
Fig.19D 0V
WL1~WL4

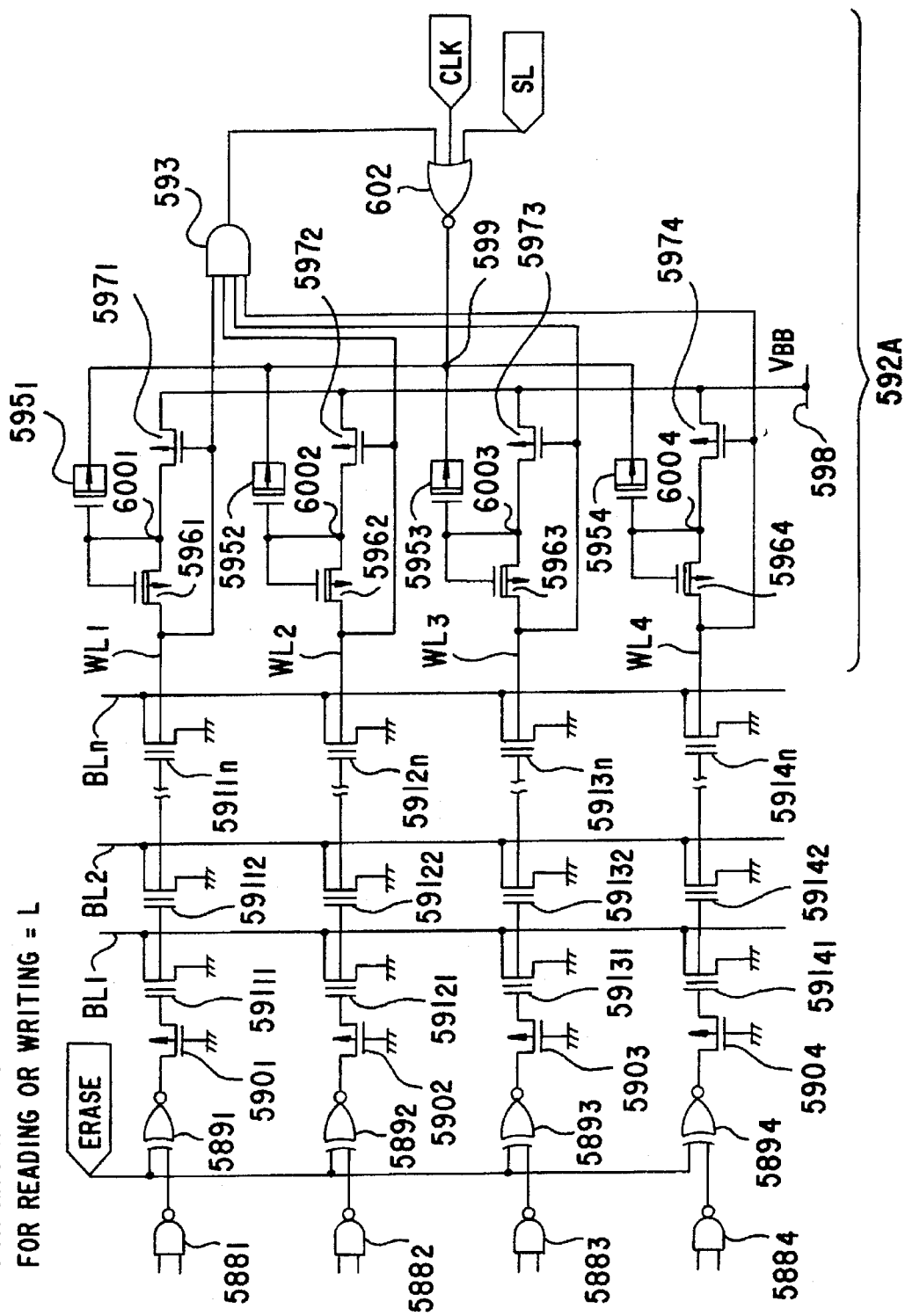

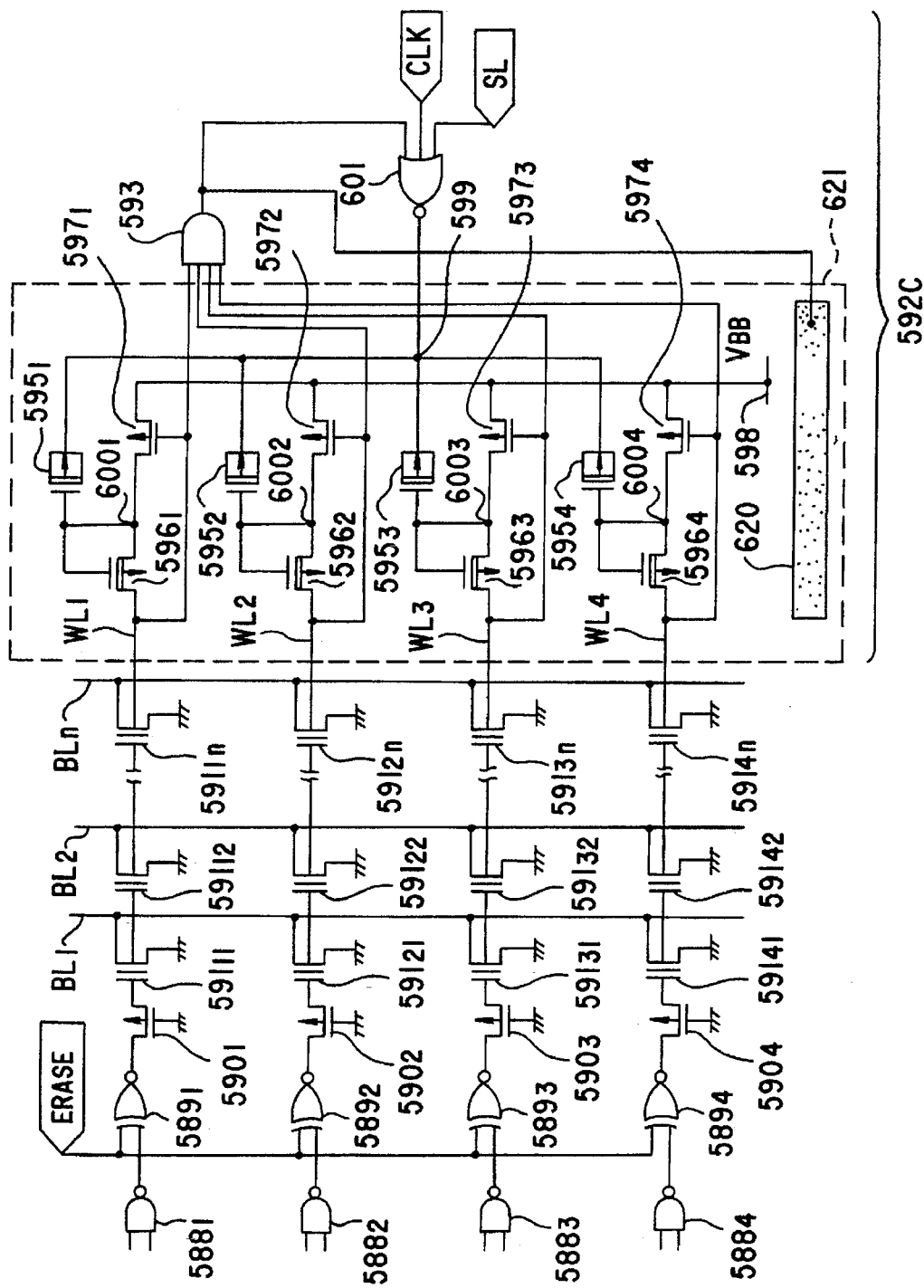

NEGATIVE VOLTAGE CIRCUIT FOR A FLASH MEMORY

This is a division of application Ser. No. 08/098,406 filed Aug. 6, 1993 abandoned.

TECHNICAL FIELD

The present invention relates to a so-called flash memory or a nonvolatile semiconductor memory from which existent information can be electrically erased concurrently or block by block. In particular, this invention is concerned with improvements in erasing a flash memory and improvements in the associated circuitry.

In recent years, a variety of semiconductor memories such as an electrically erasable programmable read only memory (EEPROM), which can be rewritten by electrically erasing data stored therein, have been developed in the field of nonvolatile memories.

The semiconductor memories are nonvolatile memories which are made rewritable by electrically erasing specified data previously written therein.

As for this kind of nonvolatile memory, in consideration of the use as a substitute for a magnetic storage or the like, efforts have been made to increase the capacity and decrease the cost. For use in a portable information processing terminal or the like, however, it is required to lower the voltage requirements.

Known semiconductor memories, which are nonvolatile memories that are made rewritable by erasing specified data previously written therein, include an erasable programmable read only memory (EPROM) and the EEPROM.

The EPROM has the advantage of a small cell size. However, data erasing is a nuisance because ultraviolet light must be used to erase data. As for the EEPROM, data erasing is easy to do because data can be erased electrically. However, the cell size in the EEPROM is larger than that in the EPROM, which makes it difficult to increase the capacity of an EEPROM.

As a semiconductor memory having the advantages of the foregoing memories, for example, what is referred to as a flash memory has been developed.

The term "flash memory" will be adopted in the succeeding description.

BACKGROUND ART

The nonvolatile semiconductor memory has an overall configuration, for example, as that shown in FIG. 1. In FIG. 1, N cell blocks $11_1$ to $11_N$ (for example, eight blocks) each having multiple transistor cells are arranged in a row. The cell blocks $11_1$ to $11_N$ are provided with bit line select circuits $12_1$ to $12_N$ and sense amplifiers/sense buffers $13_1$ to $13_N$ respectively.

A row address signal is supplied from a row address buffer 14 to each of the cell blocks $11_1$ to $11_N$ via a row decoder 15. A column address signal is supplied from a column address buffer 16 to each of the bit line select circuits $12_1$ to $12_N$ via a column address decoder 17. A voltage $V_S$ sent from a source power supply circuit 18 is applied to each of source electrodes of the transistor cells of the cell blocks $11_1$ to $11_N$.

FIG. 2 shows the cell block 11, one of the cells blocks in the aforesaid nonvolatile semiconductor memory, and its peripheral circuitry. In FIG. 2, components identical to those in FIG. 1 bear the same reference numerals, of which a description will be omitted. In FIG. 2, the bit line select circuit 12 comprises n-channel MOS field-effect transistors Q1 to Qn. Column address signals Y1 to Yn are fed from the column decoder 17 to the gates of the transistors Q1 to Qn.

The cell block 11 comprises a total of n by n field-effect transistors Q11 to Qnn having floating gates and control gates. The gates of n transistors Qi1 to Qin (where, i=1, 2, etc., and n) arranged in tandem are provided with row address signals Xi sent from the row decoder 15 via word lines.

The drains of the n transistors Q1i to Qni arranged in tandem are connected to the drains of the transistors Qi in the bit line select circuit 12 via bit lines. Voltage from the source power circuit 18 is applied to each of the sources of the transistors Q11 to Qnn. A cell amplifier 13a and a write buffer 13b are connected to each of the sources of the transistors Q1 to Qn.

In the foregoing semiconductor memory, when row addresses Xi and column addresses Yi are selected for writing, data read from the write buffer 13 are written in the transistors Qij of the cell blocks $11_1$ to $11_N$. Writing is performed simultaneously on one bit per each of the cell blocks $11_1$ to $11_N$ or a total of N bits designated with the row addresses and column addresses. Data erasing is performed concurrently on all transistors in the cell blocks $11_1$ to $11_N$.

In a flash memory, information is retained depending on the presence or absence of a charge in a memory cell. FIG. 3 shows an example of a structure of a memory cell. As shown in FIG. 3, a gate has a two-layered structure consisting of a control gate (CG) 25 and a floating gate (FG) 24. The control gate 25 is connected to a word line WLi and a drain (D) 23 is connected to a bit line BLi. Reference numeral 26 denotes a tunneling oxide film.

The flash memory is broadly divided into two types of what are referred to as NOR and NAND. These types differ from each other in a method of writing, reading, or erasing information into or from a memory cell. Taking the NOR type flash memory as an example, writing, reading, or erasing information into or from a memory cell will be described below.

When information is to be written in a memory cell having the aforesaid structure, as shown in FIG. 4, the word line WLi is set to Vpp (approx. 12 V), the bit line BLi is set to approx. 6 V, and the source S is set to 0 V. High voltage is then applied to the control gate CG and drain D. Current then flows into the memory cell. Part of the electrons flowing through the memory cell are accelerated due to the high electric field in the vicinity of the drain D, gain energy, and then goes beyond the energy barrier of an insulating film of the floating gate. The electrons are finally injected into the floating gate FG. The floating gate FG is not electrically coupled with other circuits, so it therefore can retain charges on a semi-permanent basis.

When information is to be read from a memory cell, as shown in FIG. 5, the word line WLi is set to Vcc (about 5 V), the bit line BLi is set to about 1 V, and the source S is set to 0 V. The memory cell is then selected by specifying the word line WLi and bit line BLi. The threshold value of the cell transistor varies depending on the charges retained in the floating gate FG. Current flowing through the selected memory cell varies depending on the information stored therein. The information therefore can be read out by detecting and amplifying the current.

The voltage levels of the control gate CG, drain D, source S, and substrate PS in the aforesaid operative states are set to the values listed in Table 1.

TABLE 1

| | Voltages in modes in a prior art | | | |
|---|---|---|---|---|
| | CG | D | S | PS |
| Reading | Vcc | to 1 V | 0 V | 0 V |
| Writing | Vpp | to 6 V | 0 V | 0 V |
| Erasing | 0 V | Float | Vpp | 0 V |

When information is to be erased from a memory cell, as shown in FIG. 6, the word line WLi is set to about 0 V and the bit line BLi is opened. In this state, the drain D is opened, about 0 volt is applied to the control gate CG, and a high voltage of about 12 volts is applied to the source S.

Since a high voltage is applied to the source S, deep diffusion is required in order to increase the resistivity of the diffused layer in the source. This hinders reduction in cell area.

For divided erasing, it is required that the Vss line in the source must partly have a different voltage. This leads to disconnection or an increased number of drive circuits. Eventually, chip size increases.

A solution to the above problem is to apply a negative voltage to the word line WLi. To be more specific, as shown in FIG. 7, a negative voltage (about–10 V) is applied to the control gate CG and Vcc (about 5 V) is applied to the source S. The drain D is opened. Erasing is then executed.

In this case, since a low voltage is applied to the source S, the resistivity of the source need not be intensified. This contributes to reduction in cell size. Partial erasing is enabled by selectively applying negative voltage to the control gates CG.

The aforesaid erasing method is a source erasing method in which charges in the floating gate FG are routed to the source. A channel erasing method is also available, wherein charges in the floating gate are routed to a channel; that is, a substrate. Even in this method, negative voltage is applied to the control gate. The channel erasing method is sometimes employed for the aforesaid NAND-type flash memory.

FIGS. 8 to 11 show the states of a memory cell with voltage applied according to various erasing methods. In FIGS. 8 to 11, the memory cell is an n-channel transistor.

FIG. 8 shows a state in which positive voltage is applied according to a channel erasing method. The drain D and source S are opened, and the control gate CG is set to 0 V. The high voltage Vpp is applied to the P well equivalent to a channel. In channel erasing, a triple-well structure shown in FIG. 8 is adopted because positive bias is applied to the channel.

FIG. 9 shows a state in which a positive voltage is applied according to the source erasing method. The drain D is opened, and then the control gate CG is set to 0 V. The high voltage Vpp is applied to the source S. The substrate is opened or set to 0 V.

FIG. 10 shows a state in which a negative voltage is applied according to the channel erasing method. The drain D and source S are opened, and the control gate CG is set to a negative voltage $V_{BB}$. A positive voltage Vcc is applied to the p well equivalent to a channel. $V_{BB}$–Vcc is applied between the control gate CG and channel.

FIG. 11 shows a state in which negative voltage is applied according to the source erasing method. The drain D is opened, and then the control gate CG is set to the negative voltage $V_{BB}$. The source S is set to the positive voltage Vcc.

The resistivity of a junction in a source region can be improved by applying negative voltage to a control gate during erasing. This has the advantage of enabling reduction of a cell area. It is, however, a big problem how to realize application of negative voltage to the control gate.

It is, for example, conceivable to apply negative voltage from a row decoder to word lines. The voltage to be applied to a word line is changed depending on whether the word line is selected or not. In a flash memory, the voltage to be applied to a word line must be varied depending on whether the read mode or write mode is selected. When the row decoder is used to apply a negative voltage, the voltage to be applied to a word line must be changed to a negative voltage. A word line selected in the read or write mode has a higher voltage than other unselected word lines. For erasing, however, the selected word line must have a lower voltage than the unselected word lines. The level of applied voltage must therefore be reversed depending on the logic of selected or unselected word lines. This results in complex circuitry, making downsizing in possible.

DISCLOSURE OF THE INVENTION

The present invention attempts to solve the aforesaid problems, and has the following objects:

To realize a simple structure that enables selective application of negative voltage to word lines.

For attaining the object, a flash memory based on the seventh mode of the present invention is provided with a negative voltage source independently of a row decoder. The negative voltage source is connected to word lines via a negative voltage bias circuit comprising a capacitor to one end of which a clock pulse is supplied, a first p-channel MIS field-effect transistor whose drain is connected to a negative voltage output terminal and whose gate and source are connected to the other end of the capacitor, and a second p-channel MIS field-effect transistor whose drain is connected to the source of the first p-channel MIS field-effect transistor, whose gate is connected to the negative voltage output terminal, and whose source is provided with negative voltage. When negative voltage is applied, the row decoder outputs a word line application signal whose logic is reversed. A logic circuit extends control so that when a word line application signal whose logical value is low is output, a clock pulse will be fed to the negative voltage bias circuit.

In a flash memory based on the present invention, the foregoing negative voltage bias circuit is used to control whether or not to apply negative voltage depending on whether or not a clock signal is to be input. The input of a clock signal is controlled by a decoded signal sent from the row decoder, which enables selective application of negative voltage. Although another system independent of the row decoder is employed for negative voltage application, since an existing row decoder is used to select word lines, a simple circuitry ensues. Moreover, downsizing is possible.

BRIEF DESCRIPTION OF THE DRAWINGS

FIG. 4 shows the conditions for writing; FIG. 5 shows the conditions for reading; FIG. 6 shows the conditions for erasing; FIG. 7 shows the conditions for erasing based on negative-voltage application;

FIGS. 17A to 17C show waveforms for explaining the operations of the embodiment;

FIG. 18 is a circuit diagram showing a major section of another embodiment;

FIGS. 19A to 19D show waveforms for explaining the operations of the circuit in FIG. 18;

FIG. 24 is a circuit diagram showing a major section of another embodiment.

BEST MODE FOR CARRYING OUT THE INVENTION

In the present invention, negative voltage from a negative-voltage generator, which is installed independently, is applied selectively to word lines in response to signals sent from row decoders. Row decoders for specifying word lines need not be installed in the negative voltage generator. The negative voltage generator can therefore be reduced in scale. To begin with, an embodiment of a negative-voltage bias circuit for realizing a flash memory based on the present invention will be described.

Figure 12:
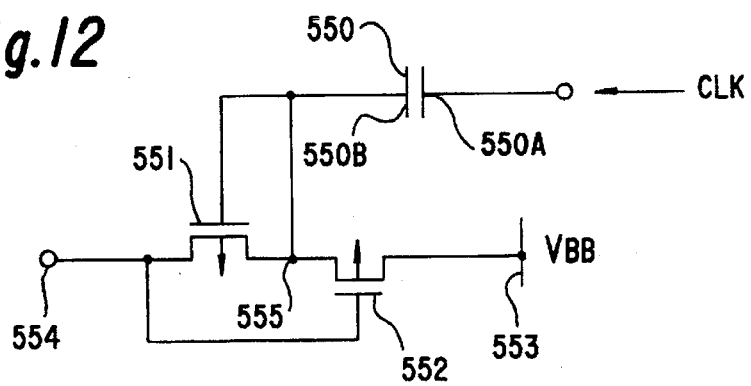
FIG. 12 is a diagram for explaining the principle of a negative voltage bias circuit for use in the embodiment.

FIG. 12 is an explanatory diagram for the principle of a negative-voltage bias circuit based on the seventh mode of the present invention. Reference numeral 550 denotes a capacitor; 551 and 552 denote p-channel metal insulator semiconductor (pMIS) field-effect transistors (hereinafter, pMIS transistor); 553 denotes a voltage line for applying a negative voltage $V_{BB}$; and 554 denotes a negative-voltage output terminal for outputting the negative voltage $V_{BB}$. During negative-voltage output, a clock pulse CLK is fed to one terminal of the capacitor 550.

A negative-voltage bias circuit based on this mode comprises the capacitor 550 one of whose ends 550A inputs the clock pulse CLK during negative-voltage output, the pMIS depletion-type transistor 551 whose drain is connected to the negative-voltage output terminal 554 and whose gate and source are connected to the other terminal 550B of the capacitor 550, and the pMIS transistor 552 whose drain is connected to the source of the pMIS transistor 551, whose gate is connected to the negative-voltage output terminal 554, and whose source is provided with the negative voltage $V_{BB}$.

Figure 13A:
FIGS. 13A to 13C show waveforms for explaining the operations of the negative voltage bias circuit in FIG. 12.
Figure 13B:
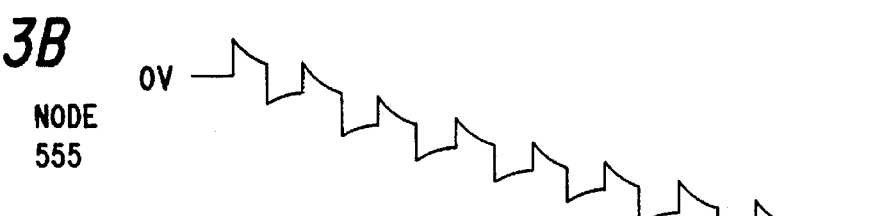
Figure 13C:

In the foregoing negative-voltage bias circuit, when the clock pulse CLK shown in FIG. 13A is applied to the terminal 550A of the capacitor 550, the levels at a node 555 and the negative-voltage output terminal vary as shown in FIGS. 13B and 13C. The negative voltage $V_{BB}$ is induced in the negative-voltage output terminal 554, which imitates a state in which the negative voltage $V_{BB}$ is applied to the negative-voltage output terminal 554.

When the clock pulse CLK applied to the terminal 550A of the capacitor 550 reverses in polarity from positive to negative, the level at the node 555 drops due to capacitive coupling. As a result, the pMIS transistor 551 is turned on. Charges then move from the negative-voltage output terminal 554 to the node 555 until the level at the negative-voltage output terminal 554 is equal to the level at the node 555.

When the clock pulse CLK reverses in polarity from negative to positive, the level at the node 555 rises due to capacitive coupling. As a result, the pMIS transistor 551 is turned off and the pMIS transistor 552 is turned on. Charges then move from the node 555 onto the voltage line 553 until the difference in level between the node 555 and voltage line 553 becomes equal to the threshold voltage of the pMIS transistor 552.

When the above operation is repeated, the negative voltage $V_{BB}$ is induced in the negative-voltage output terminal 554, which is equivalent to a state in which the negative voltage $V_{BB}$ is applied to the negative-voltage output terminal 554. More particularly, the condition under which the negative-voltage bias circuit of the present invention operates normally is represented as the expression (1):

$$Vs > |Vth1 + Vth2| \qquad (1)$$

where, Vs is the amplitude at the node 555, and Vth1 and Vth2 are the threshold voltages of the pMIS transistors 551 and 552.

As the levels at the negative-voltage output terminal 554 and node 555 decrease, Vth1 and Vth2 increase due to what is referred to as a "back-gate effect." When an enhancement pMIS transistor is used as the pMIS transistor 551, the conditional expression of expression (1) is not satisfied in some states.

In contrast, when a depletion-type pMIS transistor is used as the pMIS transistor 551, even if Vth1 and Vth2 increase due to the back-gate effect, in no state is the conditional expression of expression (1) not satisfied. It is therefore a must that a depletion-type pMIS transistor be used as the pMIS transistor 551

However, in this case, the pMIS transistor 551 is always on at the start of operation. The rise time of the clock pulse CLK for going high must be very short so that the amplitude at the node 555 will not be lower than an absolute value of the threshold voltage of the pMIS transistor 552.

When the levels at the negative-voltage output terminal 554 and node 555 decrease to some extent, the threshold voltage of the pMIS transistor 551 varies due to the back-gate effect. The pMIS transistor 551 functions like an enhancement pMIS transistor, whereby no current flows back from the pMIS transistor 551, and more charges move from the node 555 to the voltage line 553.

When the capacitor 550 is realized with an enhancement n-channel MIS field-effect transistor (hereinafter, nMIS transistor), the gate-source voltage is usually 0 V or lower. In the meantime, no channel is formed.

When no channel is formed, the capacity of the gate of a MIS transistor is about 30% of the capacity when a channel is formed. It is therefore not impossible but not preferable that an enhancement nMIS transistor is used as the capacitor 550.

When the capacitor 550 is realized with an enhancement pMIS transistor, the gate-source voltage exceeds the threshold voltage of the pMIS transistor for some period. No channel is formed for that period. The amplitude of a clock pulse CLK can therefore not be transmitted to the node 555 efficiently. It is therefore not impossible but not preferable that an enhancement pMIS transistor is used as the capacitor 550.

When the capacitor 550 is realized with a depletion-type nMIS transistor, if the level at the node 555 becomes lower than a certain value, the gate-source voltage of the nMIS transistor becomes lower than the threshold voltage. As a result, no channel is formed. The amplitude of a clock pulse CLK can therefore not be transmitted efficiently. It is therefore not impossible but not preferable that a depletion-type nMIS transistor is used as the capacitor 550.

When the capacitor 550 is realized with a depletion-type pMIS transistor, whatever level is set at the node 555, the gate-source voltage will not exceed the threshold value. A channel is always formed. The amplitude of a clock pulse CLK can therefore be transmitted to the node 555 efficiently. It is therefore preferable that a depletion-type pMIS transistor is used as the capacitor 550.

When a negative voltage is output, the pMIS transistors 551 and 552 may be cut off due to the back-gate effect. However, if the bias voltage of a well or substrate in which the pMIS transistors 551 and 552 are formed is set to a ground voltage Vss, an electric field applied to the oxide film at the gates of the pMIS transistors 551 and 552 is alleviated to eliminate the possibility that the pMIS transistors 551 and 552 may be cut off due to the back-gate effect.

Even when a negative voltage is not output, the clock pulse CLK is fed to the terminal 550A of the capacitor. Only when negative voltage is output, is a negative voltage $V_{BB}$ applied to the source of the pMIS transistor 552. When a negative voltage is not output, even if the ground voltage Vss is applied to the source of the pMIS transistor 552, the same operation and advantages as those provided by the negative-voltage bias circuit in FIG. 12 are available.

An embodiment in which the aforesaid negative-voltage bias circuit is implemented in a flash memory will be described next.

The embodiment will be described in conjunction with FIGS. 14 to 17.

Figure 14:
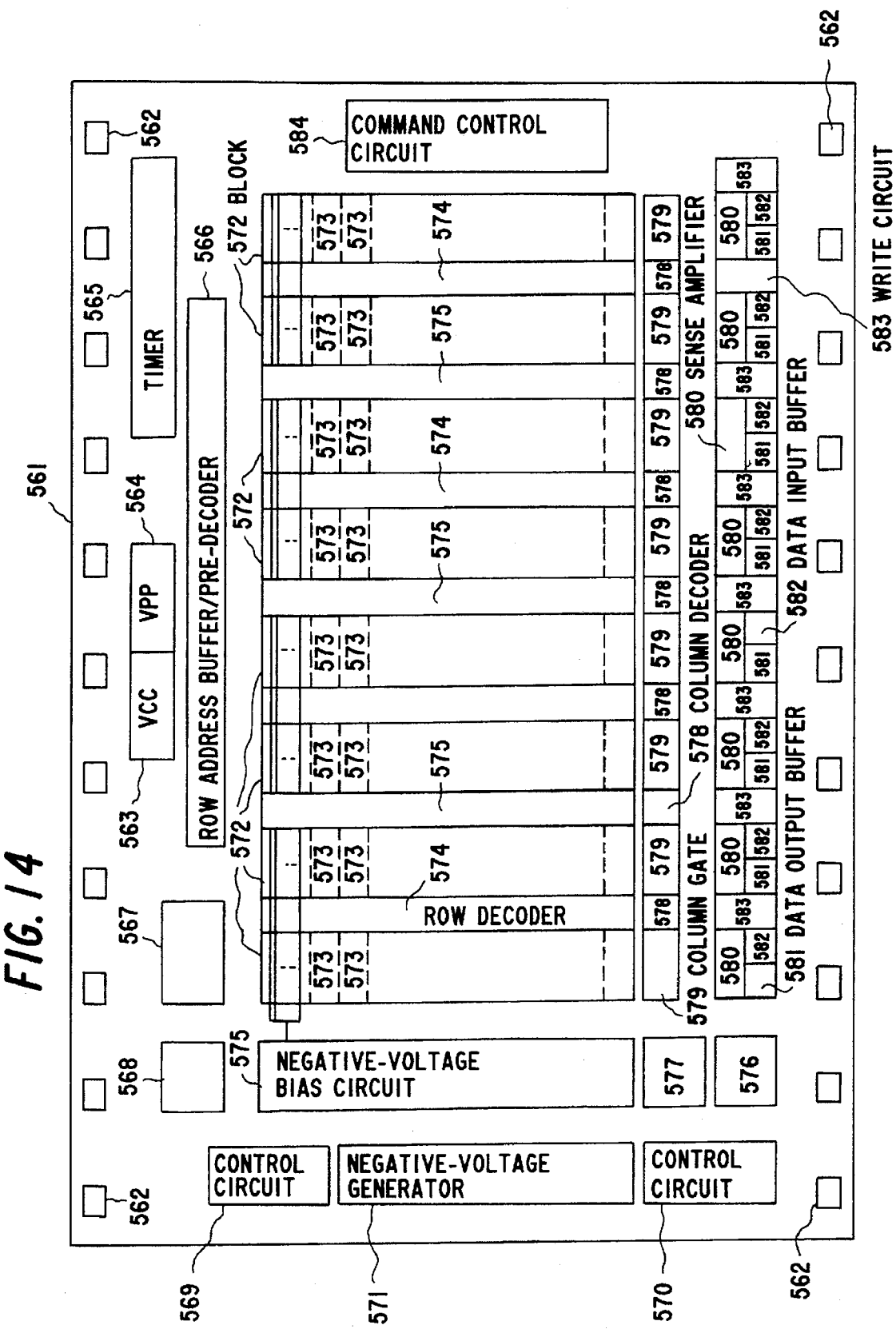
FIG. 14 is a block diagram showing a major section of a flash memory in the embodiment.

FIG. 14 is a block diagram showing a major portion of a flash memory of this embodiment. Reference numeral 561 denotes a chip body; 562 denotes a pad; 563 denotes a Vcc (supply voltage) power circuit; 564 denotes a Vpp (high voltage for writing) power circuit; 565 denotes an internal control timer; 566 denotes a row address buffer/pre-decoder; 567 denotes a row decoder power circuit; and 568 denotes a clock signal generator.

Reference numerals 569 and 570 denote control circuits. 571 denotes a negative-voltage generator; 572 denotes a block of a divided cell array made up of cell transistors which are set in an array; 573 denotes a region called a "sector" or one of segments of the block 572; 574 denotes a row decoder; and 575 denotes negative-voltage bias circuits.

Reference numeral 576 denotes a column power circuit; 577 denotes a column address buffer/pre-decoder; 578 denotes a column decoder; 579 denotes a column gate; 580 denotes a sense amplifier; 581 denotes a data output buffer; 582 denotes a data input buffer; 583 denotes a write circuit; and 584 denotes a command control circuit.

Figure 15:
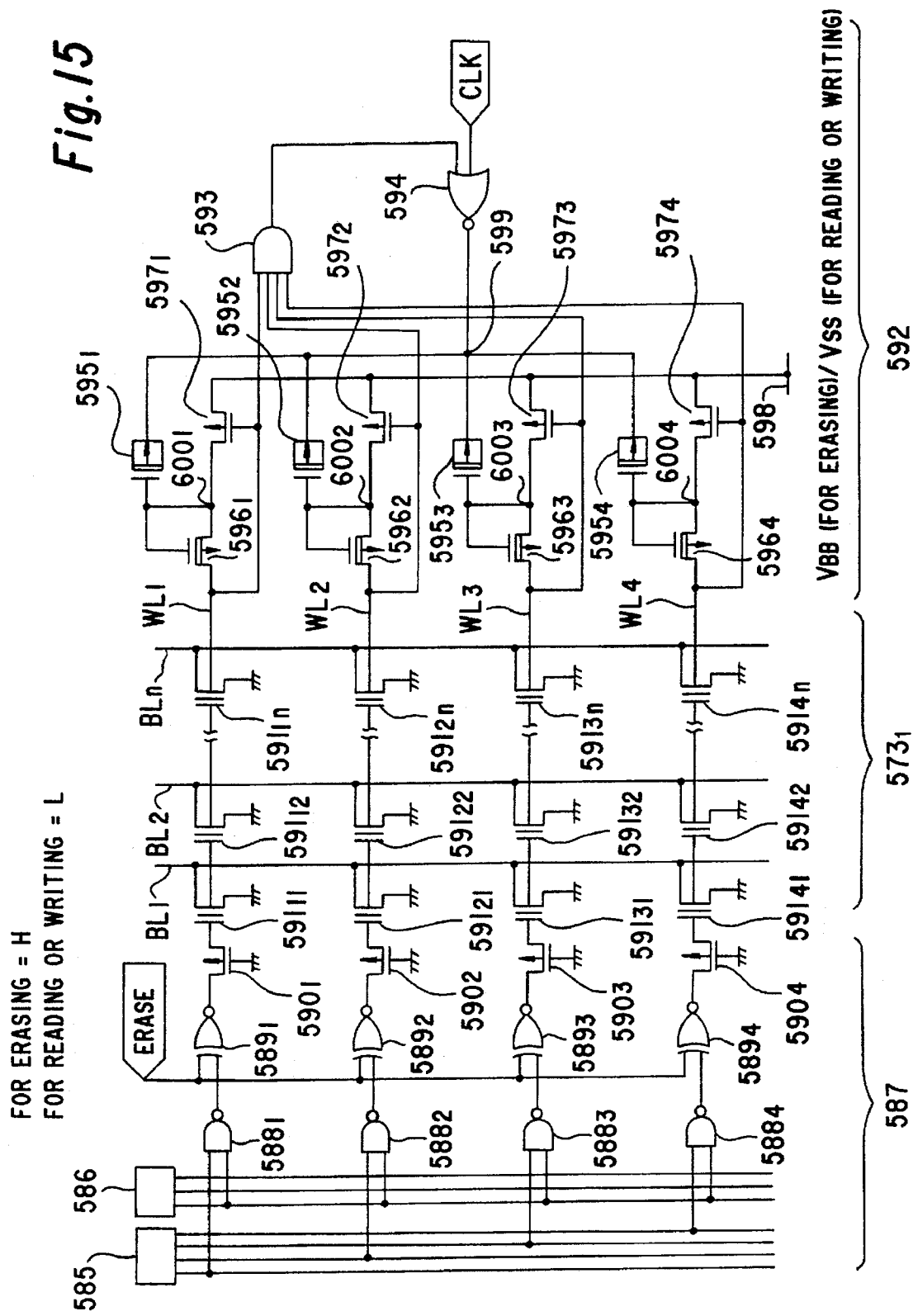
FIG. 15 is a circuit diagram showing part of the embodiment in more detail.

FIG. 15 shows a section of FIG. 14 in more detail. In the figures, 585 and 586 denote pre-decoders in the row address buffer/pre-decoder 566 (See FIG. 14); 587 denotes part of the row decoder 574 (See FIG. 14). $588_1$ to $588_4$ denote NAND circuits; and $589_1$ to $589_4$ are exclusive-NOR circuits.

Reference numerals $590_1$ to $590_4$ denote p-channel MOS field-effect transistors (hereinafter, pMOS transistor), and ERASE denotes an erase signal. The erase signal ERASE is driven low for reading or writing, and high for erasing.

Figure 1:
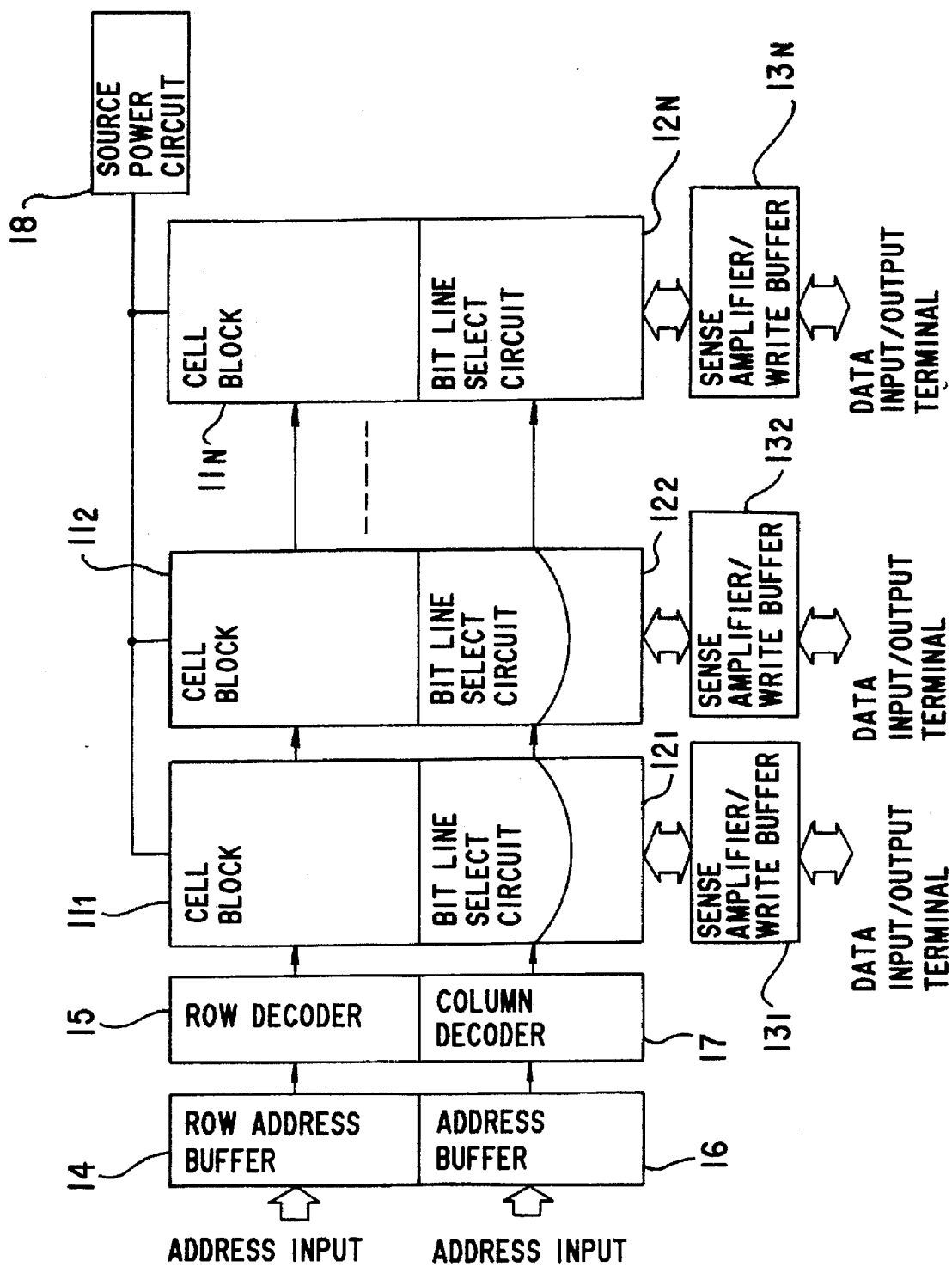
FIG. 1 shows an overall configuration of a flash memory in which the present invention is implemented.
Figure 2:
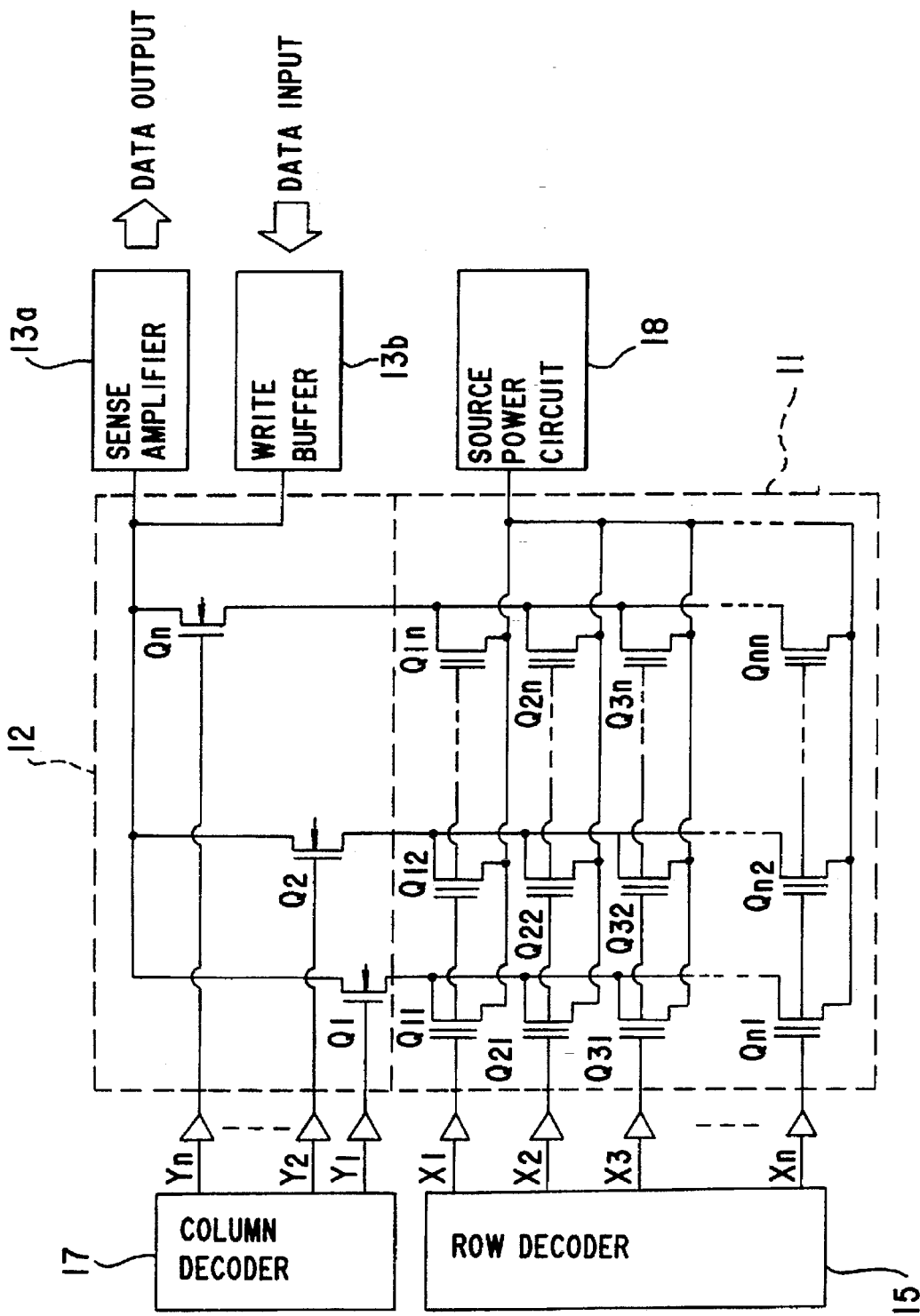
FIG. 2 is a circuit diagram showing a major section of FIG. 1.
Figure 3:
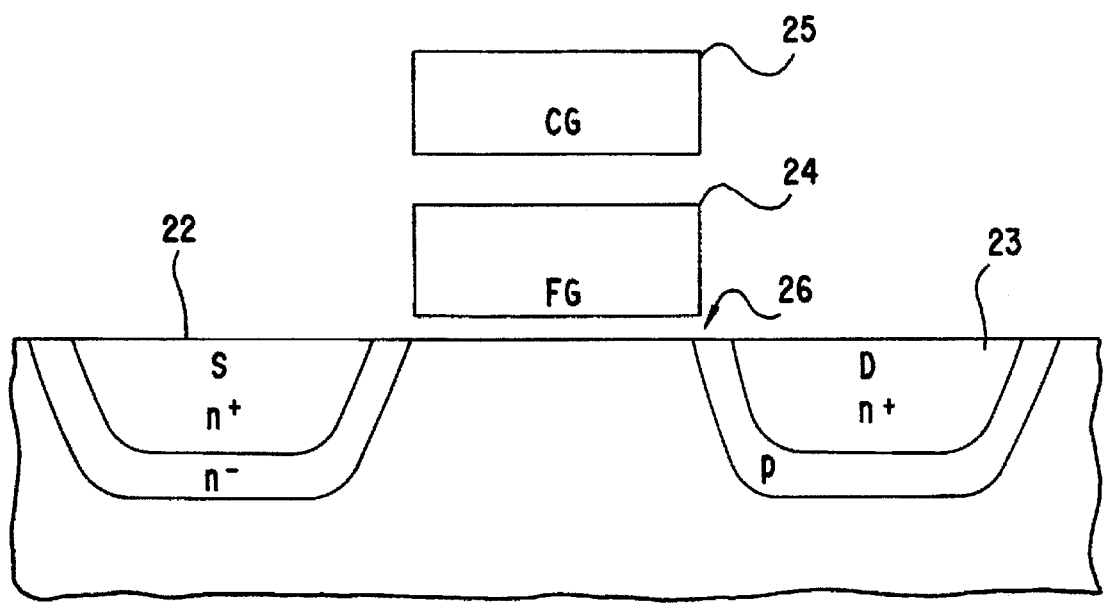
FIG. 3 shows a structure of a memory cell.
Figure 4:
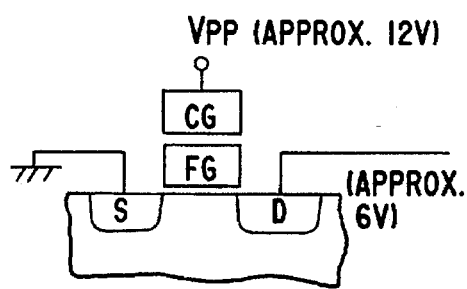
FIGS. 4 to 7 are explanatory diagrams for methods of reading, writing, and erasing a flash memory.
Figure 5:
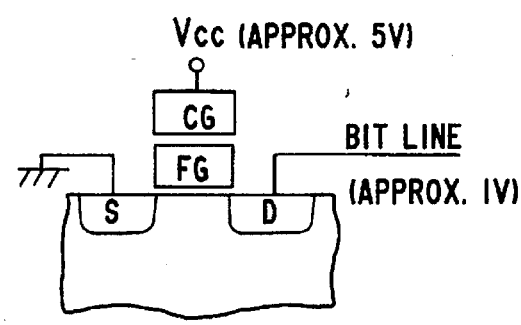
Figure 6:
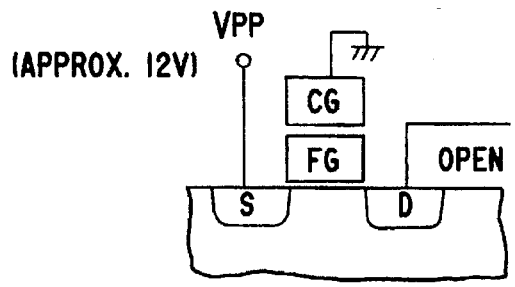
Figure 7:
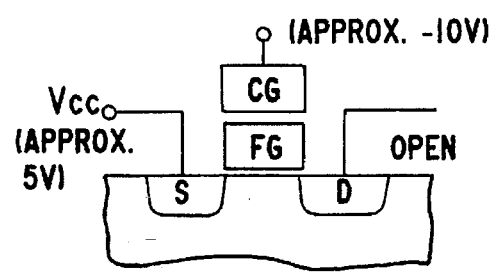
Figure 8:
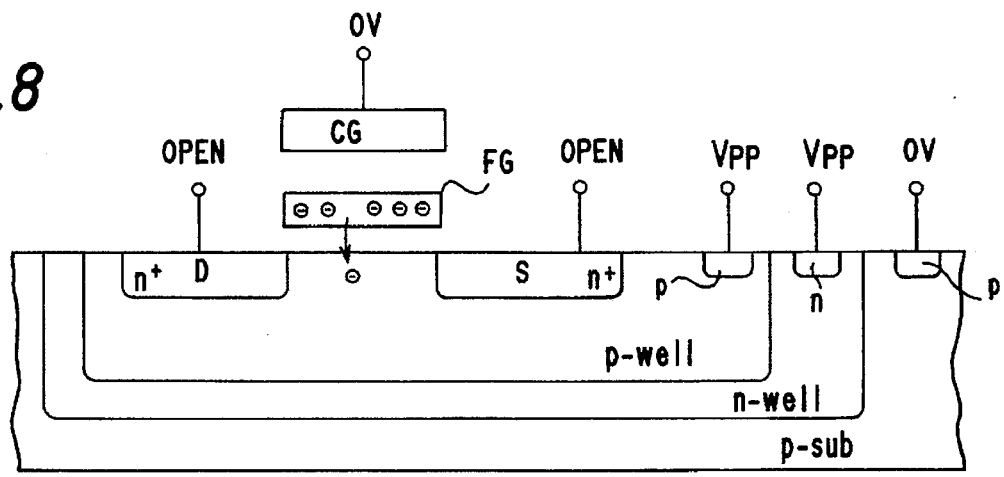
FIG. 8 is an explanatory diagram for channel erasing based on high-voltage application.
Figure 9:
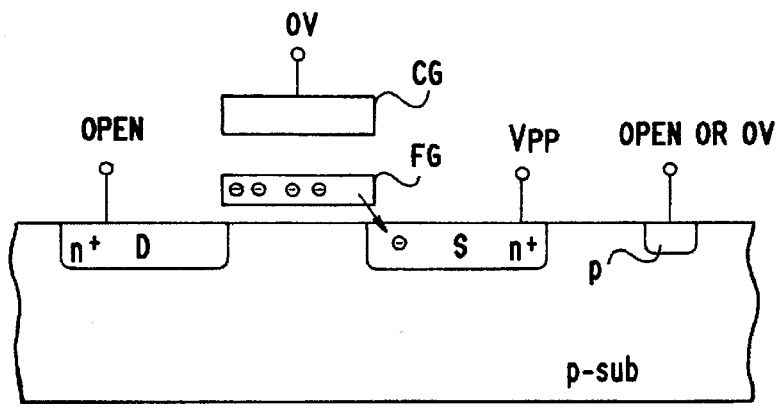
FIG. 9 is an explanatory diagram for source erasing based on high-voltage application.
Figure 10:
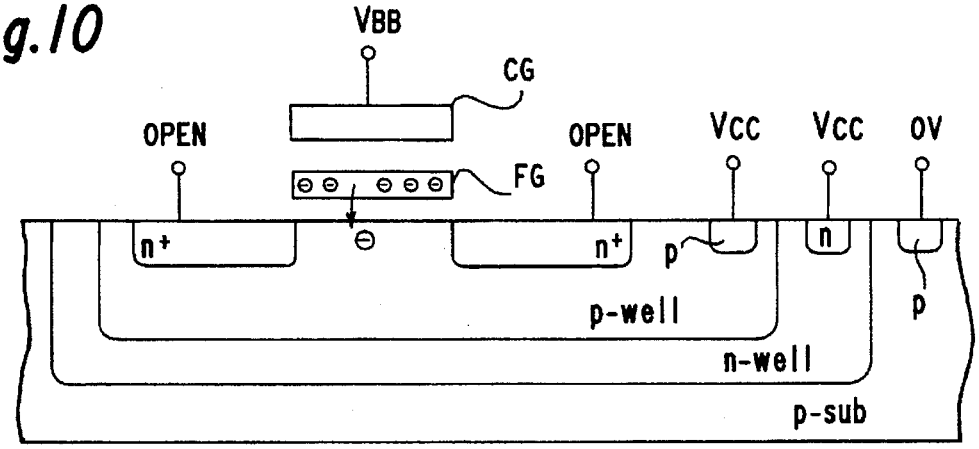
FIG. 10 is an explanatory diagram for channel erasing based on negative-voltage application.
Figure 11:
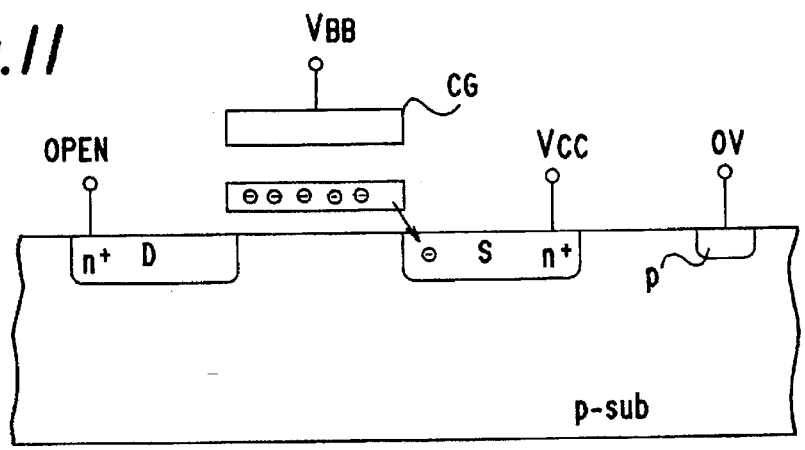
FIG. 11 is an explanatory diagram for source erasing based on negative-voltage application.

Reference numerals $573_1$ is one sector of 573. In the sector $573_1$, $591_{11}$ to $591_{4n}$ denote cell transistors; $WL_1$ to $WL_4$ denote word lines; and $BL_1$, $BL_2$, and $BL_nB$ denote bit lines. The cell transistors $591_{11}$ to $591_{4n}$ have the same circuitry as that shown in FIG. 3.

Reference numeral 592 denotes a negative-voltage bias circuit that is one of the negative-voltage bias circuits 575 (See FIG. 14); 593 denotes an AND circuit; and 594 denotes a NOR circuit. The clock pulse CLK shown in FIG. 17A is fed to the NOR circuit 594.

Reference numerals $595_1$ to $595_4$ are capacitors formed from depletion-type pMOS transistors; $596_1$ to $596_4$ are depletion-type pMOS transistors; and $597_1$ to $597_4$ are enhancement pMOS transistors.

Reference numerals 598 denotes a voltage line over which a negative voltage $V_{BB}$ is applied to the sources of the pMOS transistors $597_1$ to $597_4$ during erasing, and a ground (zero) voltage Vss is applied during reading or writing.

Figure 16:
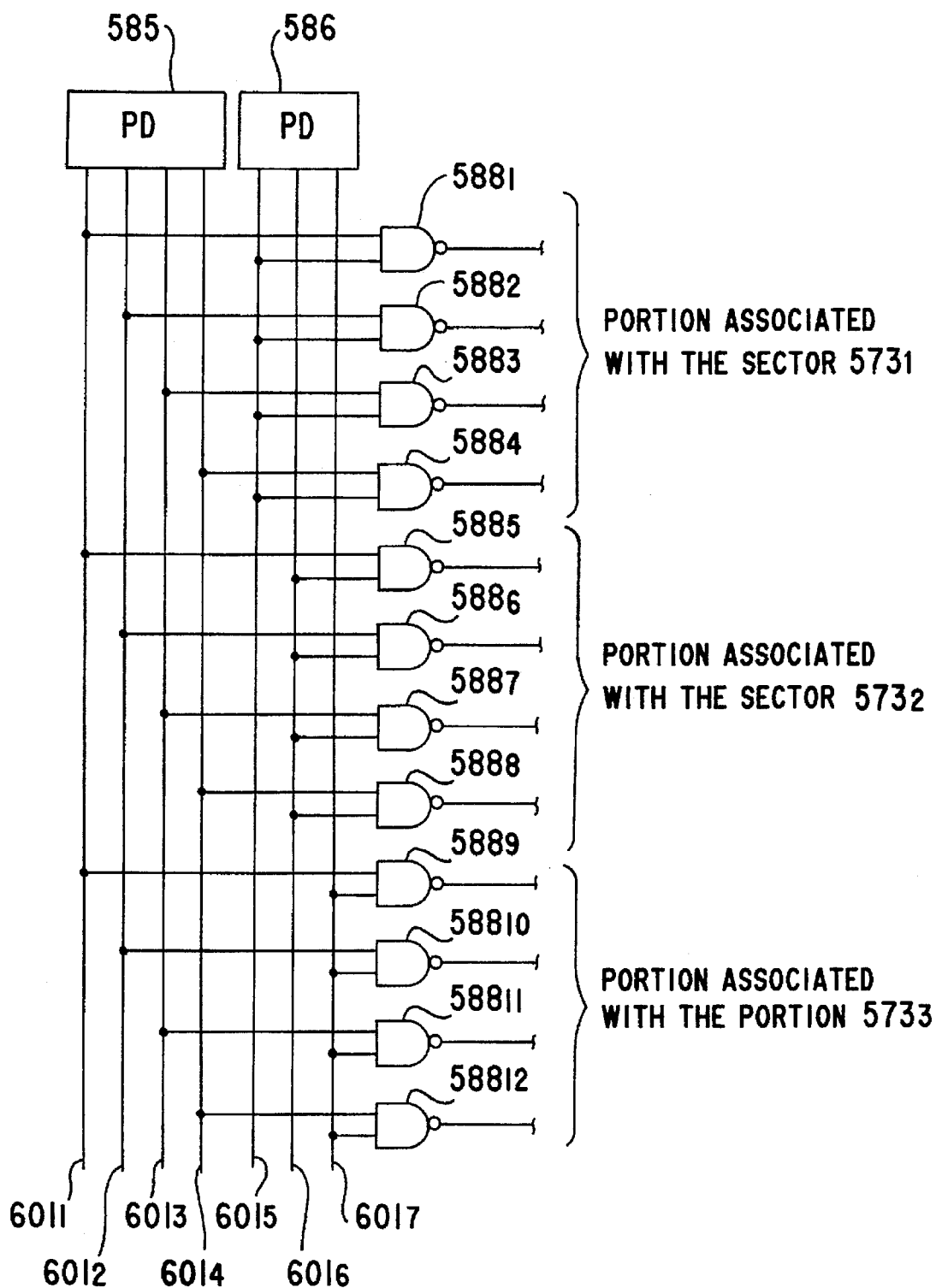
FIG. 16 is a circuit diagram showing the connection between pre-decoders and NAND circuits forming a row decoder in the embodiment.

FIG. 16 is a circuit diagram showing the connection between the pre-decoders 585 and 586, and the NAND circuits $588_1$ to $588_{12}$ forming the row decoder 587. In the figure, $601_1$ to $601_4$ denote parts of signal lines extending from the pre-decoder 585; $601_5$ to $601_7$ denote parts of signal lines extending from the pre-decoder 586; $588_5$ to $588_8$ denote NAND circuits associated with the sector $573_2$; and $588_9$ to $588_{12}$ denote NAND circuits associated with the sector $573_3$.

When any of the word lines in the sectors $573_1$ to $573_3$ are to be selected for reading or writing, the pre-decoder 585 drives appropriate ones of the signal lines $601_1$ to $604_4$ high and the others low. The output of the NAND circuit associated with a word line to be selected is thus driven low and the outputs of the other NAND circuits are driven high.

When any of the sectors $573_1$ to $573_3$ are to be selected for erasing, the pre-decoder 585 drives all the signal lines $601_1$ to $601_4$ high. The pre-decoder 586 drives appropriate ones of the signal lines $601_5$ to $601_7$ high and the others low. The output of the NAND circuit associated with a word line in a sector to be selected is driven low. The outputs of other NAND circuits are driven high.

In this embodiment, the erase signal ERASE in FIG. 15 is driven low for reading. For example, if the word line $WL_1$ is selected, the output of the NAND circuit $588_1$ is driven low and the outputs of the NAND circuits $588_2$ and $588_3$ are driven high. The word line $WL_1$ is set to high, and the word lines $WL_2$ to $WL_4$ are set to low.

As a result, the output of the AND circuit 593 goes low. The NOR circuit 594 passes the clock pulses CLK. The voltage line 598 supplies the ground voltage Vss. The circuit consisting of the capacitors $595_1$ to $595_4$ and pMOS transistors $596_1$ to $596_4$ and $597_1$ to $597_4$ need not induce the negative voltage $V_{BB}$ in the word lines $WL_1$ to $WL_4$.

In contrast, for erasing, the ERASE signal is driven high. The negative voltage $V_{BB}$ is applied instead of the ground voltage Vss to the sources of the pMOS transistors $597_1$ to $597_4$ over the voltage line 598.

For example, when the word lines $WL_1$ to $WL_4$ are unselected; that is, erasing is not performed on the cell transistors $591_{11}$ to $591_{4n}$, the outputs of the NAND circuits $588_1$ to $588_4$ are driven high.

In this case, the word lines $WL_1$ to $WL_4$ are driven high and the output of the AND circuit 593 is also driven high. The output of the NOR circuit 594 is always low. The passage of the clock pulses CLK through the NOR circuit 594 is cut off. The word lines $WL_1$ to $WL_4$ are held high.

On the other hand, when the word lines $WL_1$ to $WL_4$ are to be selected; that is, erasing is to be performed on the cell transistors $591_{11}$ to $591_{4n}$, the pre-decoders 585 and 586 select the sector $573_1$. The outputs of the NAND circuits $588_1$ to $588_4$ are driven low.

In this case, if the word line $WL_1$ is low, the pMOS transistor $590_1$ is off, and The word line $WL_1$ is held low. If the word line $WL_1$ is high, the pMOS transistor $590_1$ is turned on, and The word line $WL_1$ is driven low.

As a result, the output of the AND circuit 593 goes low. The NOR circuit 594 reverses the polarity of the clock CLK and passes the clock CLK. The level at the node 599 and the levels on the word lines $WL_1$ to $WL_4$ represent the waves shown in FIGS. 17B and 17C.

Consequently, the negative voltage $V_{BB}$ is induced in the word lines $WL_1$ to $WL_4$, which is equivalent to a state in which the negative voltage $V_{BB}$ is applied to the word lines $WL_1$ to $WL_4$. Channel erasing can be performed on the cell transistors $591_{11}$ to $591_{4n}$ connected to the word lines $WL_1$ to $WL_4$.

According to the embodiment, the negative-voltage bias circuit 592 for applying the negative voltage $V_{BB}$ to selected word lines is realized with simple circuitry. Channel erasing can therefore be achieved with simple overall circuitry.

Furthermore, since depletion-type pMOS transistors are used as the pMOS transistors $596_1$ to $596_4$. Even if the threshold voltages of the pMOS transistors $596_1$ to $596_4$ and $597_1$ to $597_4$ increase due to the back-gate effect, the negative-voltage bias circuit 592 operates normally.

The capacitors $595_1$ to $595_4$ are depletion-type pMOS transistors. Whatever levels are set at the nodes $600_1$ to $600_4$, the gate-source voltages of the capacitors $595_1$ to $595_4$ will not exceed the threshold voltages. Channels are thus formed all the time. The amplitude of the clock pulse CLK can be transmitted to the nodes $600_1$ to $600_4$ efficiently.

FIG. 18 is a circuit diagram showing a major portion of second embodiment. In the twenty-fourth embodiment, the dual-input NOR circuit 594 shown in FIG. 15 is replaced with a triple-input NOR circuit 602. The output of the AND circuit 593, clock signal CL, and select signal SL that goes low only for erasing are supplied to the NOR circuit 602. Only the negative voltage $V_{BB}$ is applied to the voltage line 598. A negative-voltage bias circuit 592A has the same circuitry as the negative-voltage bias circuit 592 in FIG. 15. The other components are identical to those in the embodiment shown in FIG. 15.

FIGS. 19A to 19D show waveforms for explaining the operations of the other embodiment performed when the output of the NAND circuit $588_1$ is driven low and the outputs of the NAND circuits $588_2$ to $588_4$ are driven high so that erasing will be executed for the cells $591_{11}$ to $591_{4n}$. FIG. 19A shows the wave of the select signal SL. FIG. 19B shows the wave of the clock pulse CLK. FIG. 19C shows the wave representing the level at the node 599. FIG. 19D shows the wave representing the level on any of the word lines $WL_1$ to $WL_4$.

In this second embodiment, similarly to the first embodiment, a negative-voltage bias circuit 592A for applying negative voltage to selected word lines is realized with simple circuitry. Channel erasing can therefore be performed with simple overall circuitry.

Similarly to the first embodiment, even if the threshold voltages of the pMOS transistors $596_1$ to $596_4$ and $597_1$ to $597_2$ increase due to the back-gate effect, the negative-voltage bias circuit 592A operates normally. The amplitude of the clock pulse CLK can be transmitted to the nodes $600_1$ to $600_4$ efficiently.

Figure 20:
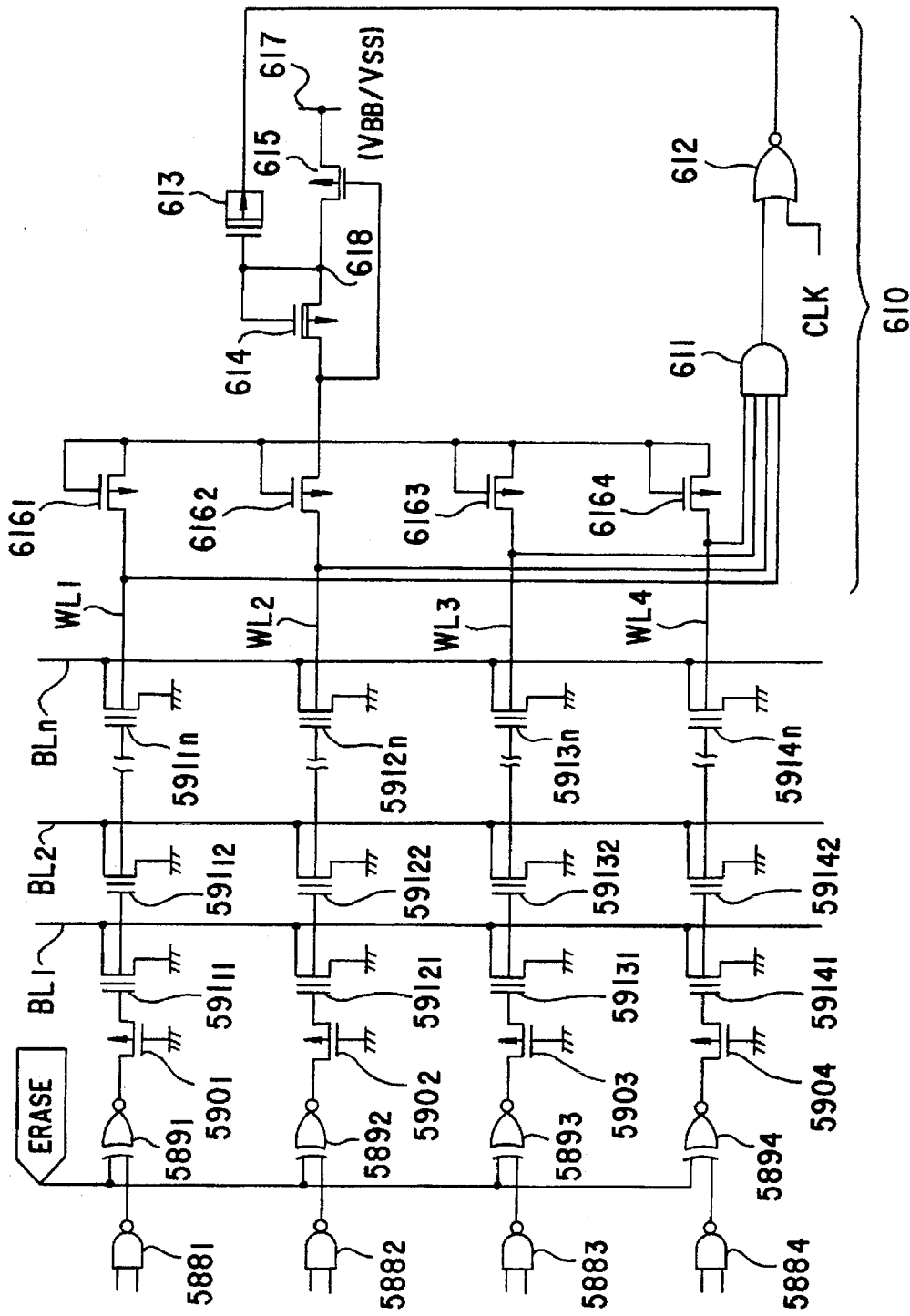
FIG. 20 is a circuit diagram showing a major section of another embodiment.

FIG. 20 is a circuit diagram showing a major portion of a third embodiment. The third embodiment includes a negative-voltage bias circuit 601 whose circuitry differs from that of the negative-voltage bias circuit 592 of the embodiment in FIG. 15. The other components are identical to those of the embodiment shown in FIG. 15.

In the negative-voltage bias circuit 610, reference numeral 611 denotes an AND circuit; 612 denotes a NOR circuit. 613 denotes a capacitor that is a depletion-type pMOS transistor; 614 denotes a depletion-type pMOS transistor; and 615, and $616_1$ to $616_4$ denote enhancement pMOS transistors.

Reference numeral 617 denotes a voltage line over which a negative voltage $V_{BB}$ is supplied for erasing and a ground voltage Vss is supplied for reading or writing. For erasing, the negative voltage $V_{BB}$ is applied to the source of the pMOS transistor 615. For reading or writing, the ground voltage Vss is applied to the source of the pMOS transistor 615.

The pMOS transistors $616_1$ to $616_4$ are installed to prevent the word lines $WL_1$ to $WL_4$ from short-circuiting when any of the word lines $WL_1$ to $WL_4$ are selected and driven high.

Even in third embodiment, similarly to the first embodiment, the negative-voltage bias circuit 610 for applying negative voltage to selected word lines for erasing is realized with simple circuitry. Channel erasing can therefore be performed with simple overall circuitry.

In the third embodiment, a depletion-type pMOS transistor is used as the pMOS transistor 614. Even if the threshold voltages of the pMOS transistors 614 and 615 increase due to the back-gate effect, the negative-voltage bias circuit 610 operates normally.

The capacitor 613 is realized with a depletion-type pMOS transistor. Whatever level is set at the node 618, the gate-source voltage of the capacitor 613 will not exceed the threshold voltage. A channel is formed all the time, so the amplitude of the clock pulse CLK can be transmitted to the node 618 efficiently.

Figure 21:
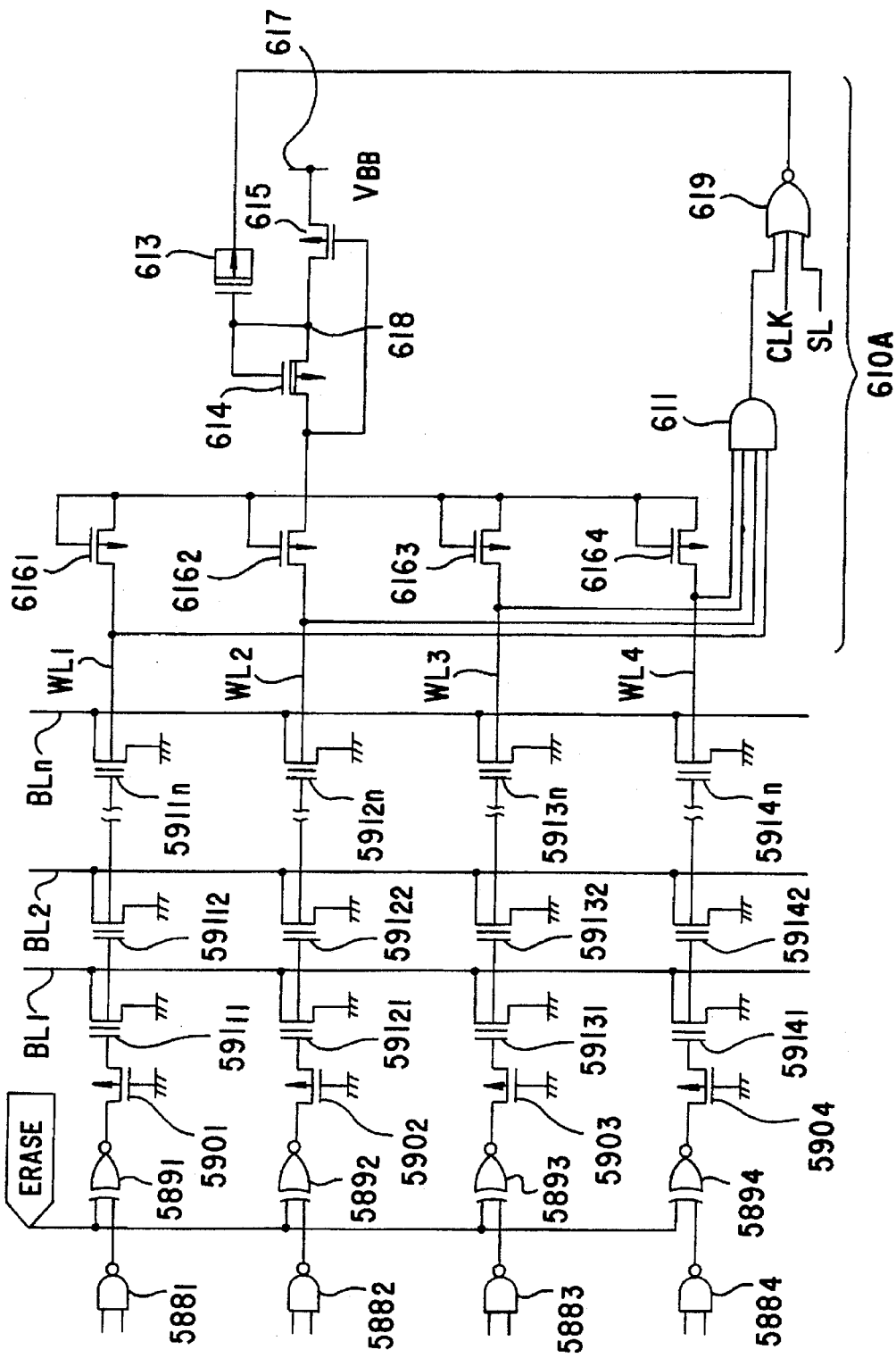
FIG. 21 is a circuit diagram showing a major section of another embodiment.

FIG. 21 is a circuit diagram showing a major portion of the fourth embodiment. In the fourth embodiment, the dual-input NOR circuit 612 shown in FIG. 20 is replaced with a triple-input NOR circuit 619. A negative-voltage bias circuit 610A in the fourth embodiment supplies the output of the AND circuit 611, clock pulse CLK, and select signal SL that goes low only for erasing to the NOR circuit 619, and places only a negative voltage $V_{BB}$ on the voltage line 617. The other components of the negative-voltage bias circuit 610A are identical to those of the negative-voltage bias circuit 610 shown in FIG. 20. The other components in the fourth embodiment are identical to those in the third embodiment.

Even in the fourth embodiment, similarly to the third embodiment, the negative-voltage bias circuit 610A for applying negative voltage to selected word lines for erasing is realized with simple circuitry. Channel erasing can be performed with simple overall circuitry.

Similarly to the third embodiment, even if the threshold voltages of the pMOS transistors 614 and 615 increase due to the back-gate effect, the negative-voltage bias circuit 610A operates normally, and The amplitude of the clock pulse CLK can be transmitted to the node 618 efficiently.

Figure 22:
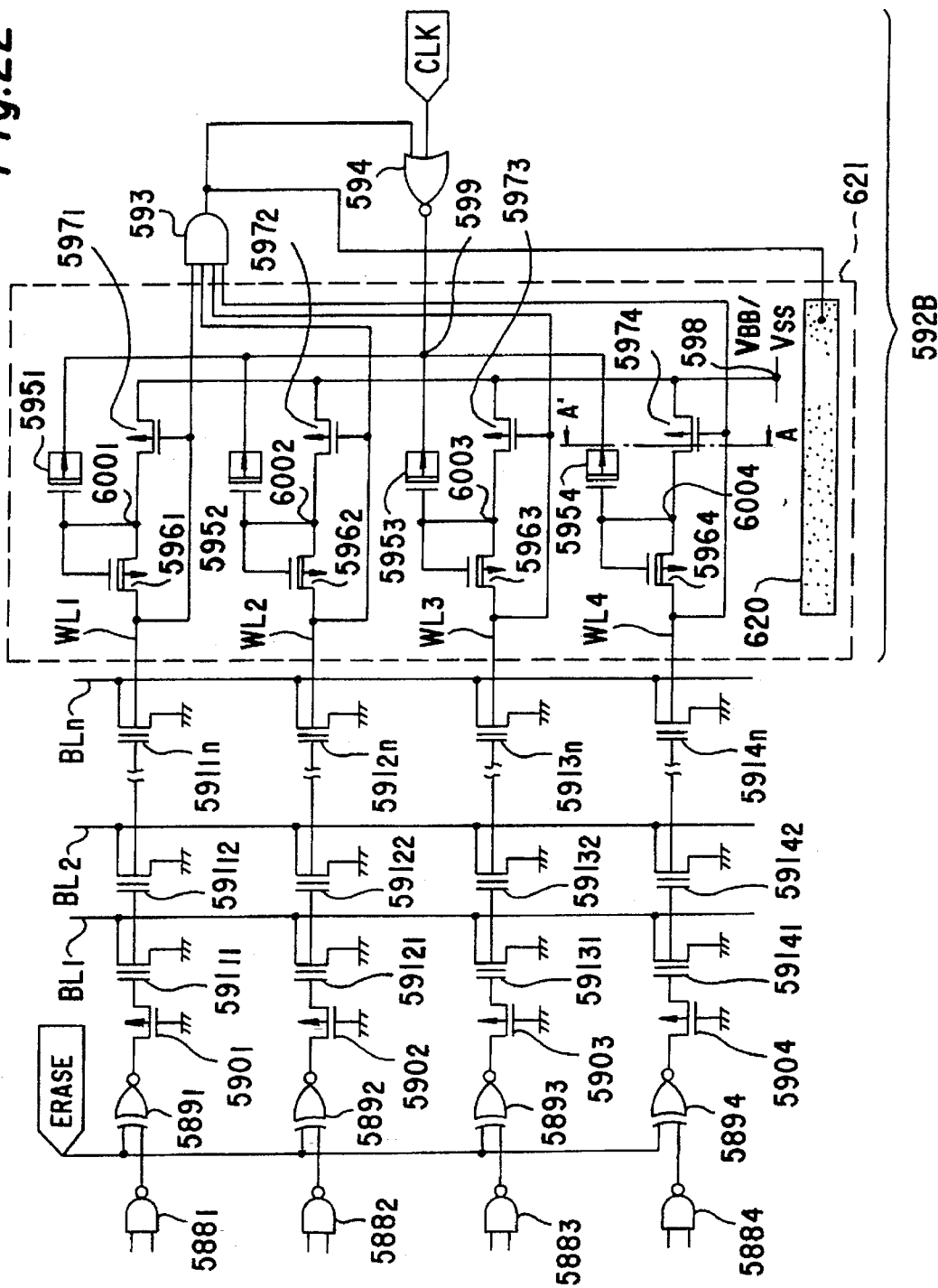
FIG. 22 is a circuit diagram showing a major section of another embodiment.

FIG. 22 is a circuit diagram showing a major portion of the twenty-seventh embodiment of a semiconductor memory according to the present invention. The fifth embodiment has a negative-voltage bias circuit 592B in which the output terminal of an AND circuit 593 is connected to an n-type well 621 including capacitors $595_1$ to $595_4$ and pMOS transistors $596_1$ to $596_4$ and $597_1$ to $597_4$. The other components of the negative-voltage bias circuit 592B are identical to those of the negative-voltage bias circuit 592 shown in FIG. 15. The other components of the fifth embodiment are identical to those of the first embodiment shown in FIG. 15.

Figure 23:
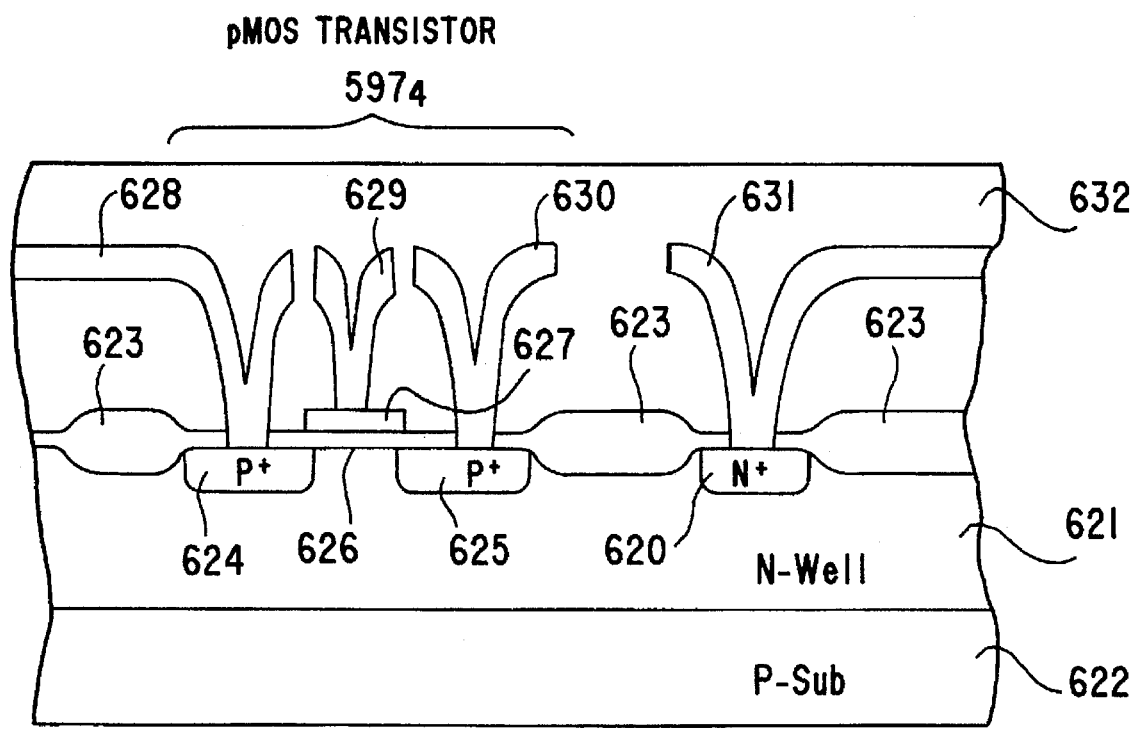
FIG. 23 shows an a cross section of FIG. 22.

FIG. 23 shows an a cross section of FIG. 22. In FIG. 23, reference numeral 622 denotes a p-type silicon substrate; 623 denotes a field oxide film; 624 denotes a drain that is a $p^+$-type diffused layer; 625 denotes a source that is a $p^+$-type diffused layer; 626 denotes a gate oxide film; 627 denotes a gate made of poly-silicon; 628 to 631 denote wiring layers made of aluminum; and 732 denotes an insulating layer.

According to the fifth embodiment, similarly to the first embodiment, the negative-voltage bias circuit 592B for applying negative voltage to selected word lines for erasing has simple circuitry. Channel erasing can therefore be performed with simple overall circuitry.

Similarly to the first embodiment, even if the threshold voltages of the pMOS transistors $596_1$ to $596_4$ and $597_1$ to $597_4$ increase due to the back-gate effect, the negative-voltage generator 592B operates normally. The amplitude of the clock pulse CLK can therefore be transmitted to the nodes $600_1$ to $600_4$ efficiently.

According to the fifth embodiment, the bias voltage for the n-type well 621 in which the capacitors $595_1$ to $595_4$ and pMOS transistors $596_1$ to $596_4$ and $597_1$ to $597_4$ are formed is set to the ground voltage Vss with the output of the AND circuit 593. Electric fields arising in the oxide film at the gates of the pMOS transistors $596_1$ to $596_4$ and $597_1$ to $197_4$ are therefore alleviated to eliminate a possibility that the pMOS transistors $596_1$ to $596_4$ and $597_1$ to $597_4$ may be cut off due to the back-gate effect.

FIG. 24 is a circuit diagram showing a major portion of the sixth embodiment. The sixth embodiment includes a negative-voltage bias circuit 592C in which a triple-input NOR circuit 601 is installed instead of the dual-input NOR circuit 594 shown in FIG. 22, and the output of the AND circuit 593, clock pulse CLK, and select signal SL that is driven low only for erasing are supplied to the NOR circuit 601. The other components of the negative-voltage bias circuit 592C are identical to those in the negative-voltage bias circuit 592B shown in FIG. 22. The other components of the sixth embodiment are identical to those of the fifth embodiment shown in FIG. 22.

Even in the sixth embodiment, similarly to the fifth embodiment, the negative-voltage bias circuit 592C for applying negative voltage to selected word lines is realized with simple circuitry. Channel erasing can therefore be performed with simple overall circuitry.

Similarly to the fifth embodiment, even if the threshold voltages of the pMOS transistors $596_1$ to $596_4$ and $597_1$ to $597_4$ increase due to the back-gate effect, the negative-voltage bias circuit 592C operates normally. The amplitude of the clock pulse CLK can therefore be transmitted to the nodes $600_1$ to $600_4$.

In the sixth embodiment, electric fields arising in the oxide film at the gates of the pMOS transistors c$596_1$ to $596_4$ and $597_1$ to $597_4$ are alleviated to eliminate the possibility of the pMOS transistors $596_1$ to $596_4$ and $597_1$ to $597_4$ being cut off.

As described above, according to the negative-voltage bias circuit based on the present invention, negative voltage can be applied with simple circuitry. When the negative-voltage bias circuit is used as a negative-voltage bias circuit for biasing word lines negatively in, for example, a channel-erasing type flash memory, channel erasing can be performed with simple overall circuitry.

When a depletion-type pMIS transistor is used as a capacitor, the gate-source voltage will not exceed the threshold voltage. A channel is formed in the transistor all the time. The amplitude of a clock pulse CLK can therefore be transmitted to a node efficiently.

When the bias voltage for a well or substrate in which pMIS transistors 11 and 12 are formed is set to a ground voltage, electric fields arising in the oxide film at the gates of the pMIS transistors are alleviated to eliminate the possibility of the pMIS transistors being cut off due to the back-gate effect.

Using a flash memory based on the present invention, since a negative-voltage bias circuit is used to negatively bias word lines for specifying cell transistors, channel erasing can be performed with simple overall circuitry.

We claim:

1. A negative-voltage bias circuit comprising:

a capacitor having first and second terminals;

a first p-channel MIS field-effect transistor whose drain is connected to a negative-voltage output terminal and whose gate and source are connected to said first terminal of said capacitor; and a second p-channel MIS field-effect transistor whose drain is connected to the source of said first p-channel MIS field effect transistor, whose gate is connected to said negative-voltage output terminal, and whose source is provided with a negative voltage;

wherein when a clock pulse is supplied to said second terminal of said capacitor during output of a negative-voltage, a potential of said negative-voltage output terminal is set to that of said negative voltage, and wherein said first p-channel MIS field-effect transistor is a depletion-type p-channel MIS field-effect transistor.

2. A negative-voltage bias circuit according to claim 1, wherein said capacitor is a depletion-type p-channel MIS field-effect transistor.

3. A negative-voltage bias circuit according to claim 1, wherein a ground voltage is applied as bias voltage to a well or substrate, in which said first and second p-channel MIS field-effect transistors are formed, during output of said negative voltage.

4. A negative-voltage bias circuit according to claim 2, wherein a ground voltage (Vss) is applied as bias voltage to a well or substrate, in which said first and second p-channel MIS field-effect transistors (551 and 552) are formed, during negative-voltage output.

5. A negative-voltage bias circuit according to claim 1, wherein a rise time of said clock pulse, which is supplied to said second terminal of said capacitor, being very short at a start of operation of said negative-voltage bias circuit.

* * * * *